United States Patent
Laursen et al.

(10) Patent No.: US 6,555,466 B1
(45) Date of Patent: Apr. 29, 2003

(54) TWO-STEP CHEMICAL-MECHANICAL PLANARIZATION FOR DAMASCENE STRUCTURES ON SEMICONDUCTOR WAFERS

(75) Inventors: Thomas Laursen, Tempe, AZ (US); Malcolm K. Grief, Chandler, AZ (US); Krishna P. Murella, Tempe, AZ (US); Sanjay Basak, Chandler, AZ (US)

(73) Assignee: Speedfam Corporation, Chandler, AZ (US)

( * ) Notice: Subject to any disclaimer, the term of this patent is extended or adjusted under 35 U.S.C. 154(b) by 0 days.

(21) Appl. No.: 09/280,767

(22) Filed: Mar. 29, 1999

(51) Int. Cl.[7] ......................................... H01L 21/4763
(52) U.S. Cl. ........................................................ 438/626
(58) Field of Search ............................... 438/689, 691, 438/692, 693, 745, 750, 754, 756, 626, 627

(56) References Cited

U.S. PATENT DOCUMENTS

| 4,968,381 A | | 11/1990 | Prigge et al. | 156/636 |
|---|---|---|---|---|
| 5,244,534 A | * | 9/1993 | Yu et al. | 156/636 |
| 5,676,587 A | * | 10/1997 | Landers et al. | 451/57 |
| 5,795,826 A | | 8/1998 | Gambino et al. | 438/692 |
| 5,801,094 A | | 9/1998 | Yew et al. | 438/624 |
| 5,853,604 A | | 12/1998 | Kim | 216/88 |
| 5,934,980 A | * | 8/1999 | Koos et al. | 451/41 |
| 6,001,730 A | * | 12/1999 | Farkas et al. | 438/627 |
| 6,004,188 A | * | 12/1999 | Roy | 451/41 |
| 6,083,840 A | * | 7/2000 | Mravic et al. | 438/693 |

FOREIGN PATENT DOCUMENTS

| EP | 0757378 A1 | 2/1997 | |
|---|---|---|---|
| EP | 0848417 A1 | 9/1997 | |
| EP | 0807492 A2 | 11/1997 | B24B/37/04 |
| EP | 0848417 A1 | 6/1998 | 21/768 |

* cited by examiner

*Primary Examiner*—David Nelms
*Assistant Examiner*—Quoc Hoang
(74) *Attorney, Agent, or Firm*—Snell & Wilmer, LLP; Laura J. Zeman; Patrick L. Mixon (57) ABSTRACT

A method of improving planarity of semiconductor wafer surfaces containing damascene and dual-damascene circuitry using chemical-mechanical polishing techniques. The method includes using a first polishing step to substantially remove excess surface metal up to a detected end point. After rinsing, a second step of chemical-mechanical polishing is applied, using a second slurry that has a higher selectivity for dielectric than metal, preferably from 1.8 to 4 or more times greater. The second step of polishing, in accordance with the invention, has been found to substantially eliminate dishing and improve planarity.

3 Claims, 7 Drawing Sheets

(Prior Art)

TWO-STEP CHEMICAL-MECHANICAL PLANARIZATION FOR DAMASCENE STRUCTURES ON SEMICONDUCTOR WAFERS

FIELD OF INVENTION

This invention relates to the fabrication of semiconductors. More particularly, it relates to a chemical-mechanical semiconductor wafer polishing process, for use with wafers that include damascene and/or dual-damascene circuit structures, that substantially reduces "dishing" and erosion to provide improved planarity.

BACKGROUND OF INVENTION

The fabrication of very large scale integrated circuits on silicon wafers is a process requiring extreme precision because of the very fine details of the circuits. Indeed, the width of circuit lines are continually decreasing, as the technology advances, and are now in the 0.18–100 micron range. Since these circuits are produced using photolithographic techniques, extremely accurately ground lenses are required to provide such fine detail. As a necessary consequence of providing such precise focusing, the lenses lack depth of field, i.e. an image is accurately produced only at a specific distance from the lens, and any deviation in this distance produces an increasingly unfocused or fuzzy image. Therefore, the surface onto which the image is projected must be as perfectly planar as possible to eliminate out of focus image fuzziness. A failure to maintain planarity exacerbates the problem as additional layers are formed on the surface resulting in an increased proportion of defective semiconductors that must be rejected.

A standard technique for restoring surface planarity after inlaying metal in dual-damascene structures within a dielectric layer, is chemical-mechanical planarization (CMP). During this process, the surface of the wafer is polished at select intervals, with a polishing pad and a chemical slurry, to remove excess metal and to replanarize it. The slurries contain an abrasive such as silica or alumina, and chemical additives that are designed to selectively react with and soften the composition of those components that must be planarized on the wafer surface. Accordingly, polishing slurries may be selected to enhance the removal rate of a particular component on the surface of the wafer, taking into account that certain of the components may be inherently more easily removed purely by abrasive action.

While aluminum has been the preferred conductive metal used in semiconductor circuitry in the past, the more recent trend is towards the use of the damascene and dual-damascene (also known as "inlaid metallization")process techniques that currently use copper, which is a superior electrical conductor. This trend towards using damascene and dual-damascene inlaying of metal lines and vias has presented new challenges in semiconductor fabrication. It has been found that during CMP there is often unacceptable levels of "dishing"and erosion of copper surfaces. Indeed, depressions of about 1,000Å or more may be formed. As pointed out above, as near perfect a planar surface is needed to enable modern fine line circuits. Dishing and erosion therefore present a serious issue in the new damascene and dual-damascene technology and a solution must be found.

SUMMARY OF THE INVENTION

The invention presents a chemical-mechanical planarization technique that includes a first polishing step, and a second polishing step for use with wafers that include circuits formed by damascene and dual damascene processes. The second polishing step is especially important, and includes using a slurry that has a higher removal rate for dielectric than for metal.

More particularly, in accordance with the invention, in a first step the semiconductor wafer is polished with a polishing pad and a first slurry until an end point is detected. This end point may be detected by any of a variety of techniques known in the art, which may simply be the elapse of a predetermined polishing time period. Preferably, the detection is of a type that facilitates an automatic transition to the next stage in the CMP.

Preferably, after the first polishing step, the surface of the semiconductor wafer is rinsed to remove surface debris and substantially all of the first slurry. After rinsing, polishing recommences, with a second slurry that removes the dielectric at a higher rate than the metal component. It is preferred that the rate of dielectric removal should be from about 1.2 to about 4 times greater than the rate of metal removal.

It has been found that the second polishing step reduces dishing and erosion, and repairs nonuniformities in the initial wafer surface topography left after the first polishing step. As a consequence, dishing is substantially reduced and planarization of the semiconductor wafer surface is improved, thereby facilitating the production of a higher proportion of semiconductors that meet specifications.

DETAILED DESCRIPTION OF THE PREFERRED EMBODIMENTS

The invention provides a chemical-mechanical planarization technique that substantially reduces "dishing" and "erosion" during the polishing of semiconductor wafers containing circuitry formed by the damascene and dual-damascene processes. The term "metal" as broadly used in the claims and specification refers to the conductive metal component of the wafer circuitry and may be formed from any of copper, silver, gold, and aluminum, each either in substantially pure form or as the major alloying component of an alloy, and also includes like conductive metals useful in the damascene and dual damascene processes. In accordance with the invention, two separate steps of chemical-mechanical polishing are used: A first step that removes substantially all excess metal that must be removed, and that is continued until a detected end point. This is followed by a second step of CMP that employs a slurry that has an about 1.2 to about 4 times higher removal rate for dielectric than the metal. Preferably, the dielectric removal rate is from about 1.5 to about 2.5 times higher than metal, and most preferably from about 1.8 to about 2.3 times higher than for metal. As explained in more detail below, the second step of polishing provides improved planarization, and substantially reduces the dishing and erosion found in prior art processes.

The invention may be better understood with reference to the attached drawings, some of which are illustrative of the invention, but which do not limit the scope of the invention as set forth in the specification and claims.

Figure 1:
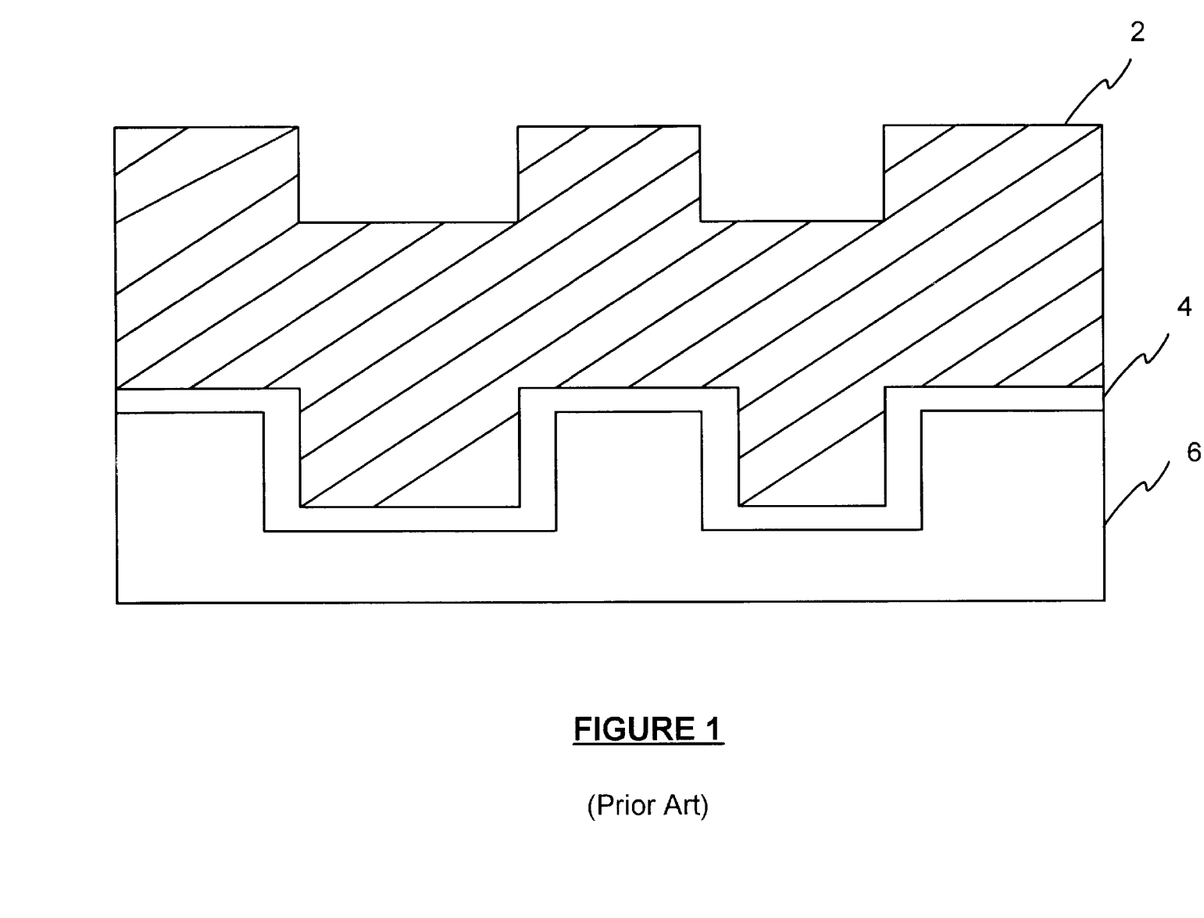
FIG. 1 is a schematic cross section of a surface portion of a semiconductor wafer formed by the damascene process showing trench structure in the dielectric onto which is formed a thin conformal barrier layer, onto which in turn is formed a layer of metal.

As a preliminary matter, FIG. 1 illustrates a simplified schematic cross section through a portion of a semiconductor wafer surface produced by the damascene process, showing three layers: An upper metal (for example, copper, aluminum, silver, gold, etc.) layer 2, formed on top of a conformal barrier (for example, tantalum) layer 4, on a dielectric (for example,an oxide such as TEOS) layer 6. This exemplary starting structure will be used to explain the invention, and contrast it with the one-step prior art CMP and an alternative two-step prior art CMP method.

Figure 2:
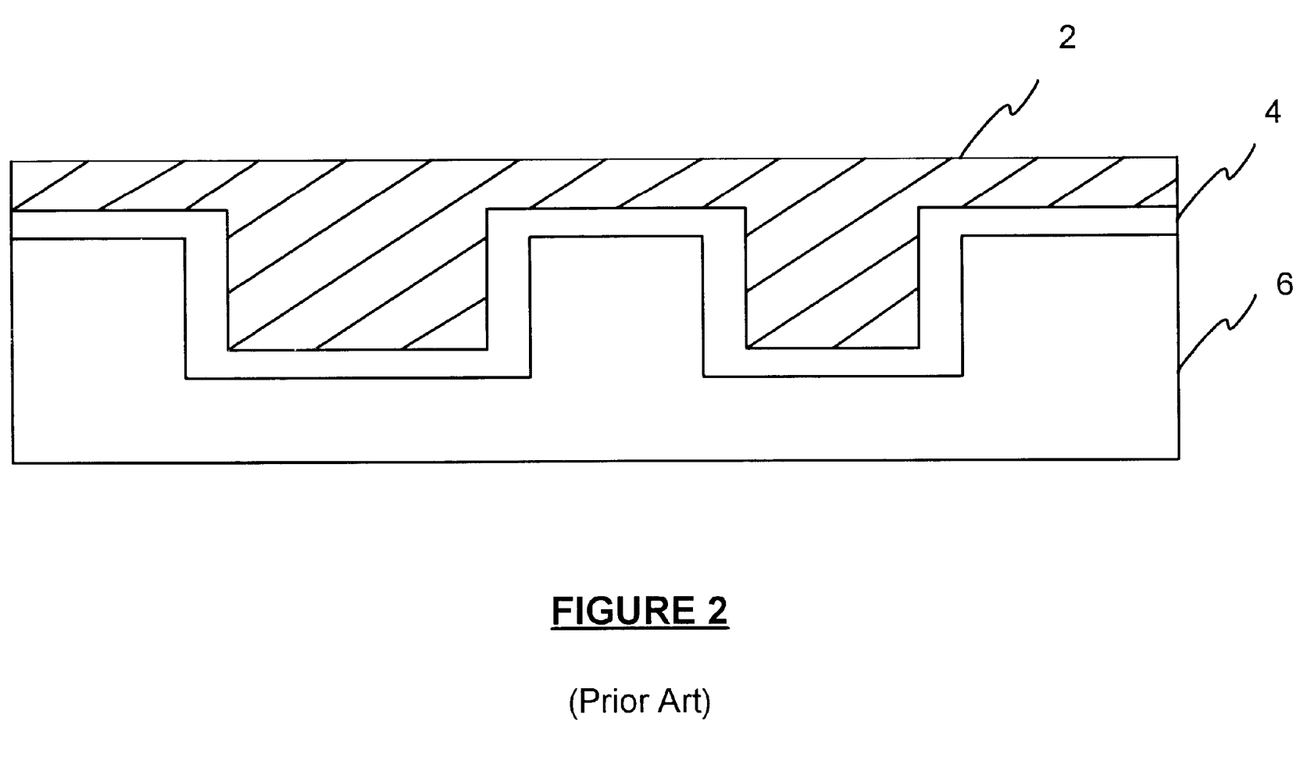
FIG. 2 is a schematic illustration of the semiconductor wafer portion of FIG. 1, after CMP has removed most of the metal layer.

FIG. 2 shows the same wafer section after planarization using a 1-step slurry process. In this figure, there is a residual thin layer of metal 2 that extends above the barrier layer 4, that must yet be removed. Further polishing in the one-step process, utilizing a slurry that is selective for metal over dielectric, results in the structure shown in FIG. 3. As can be seen, preferential metal removal has resulted in recessed metal plugs (i.e. dishing) formed in trenches in the dielectric.

Figure 3:
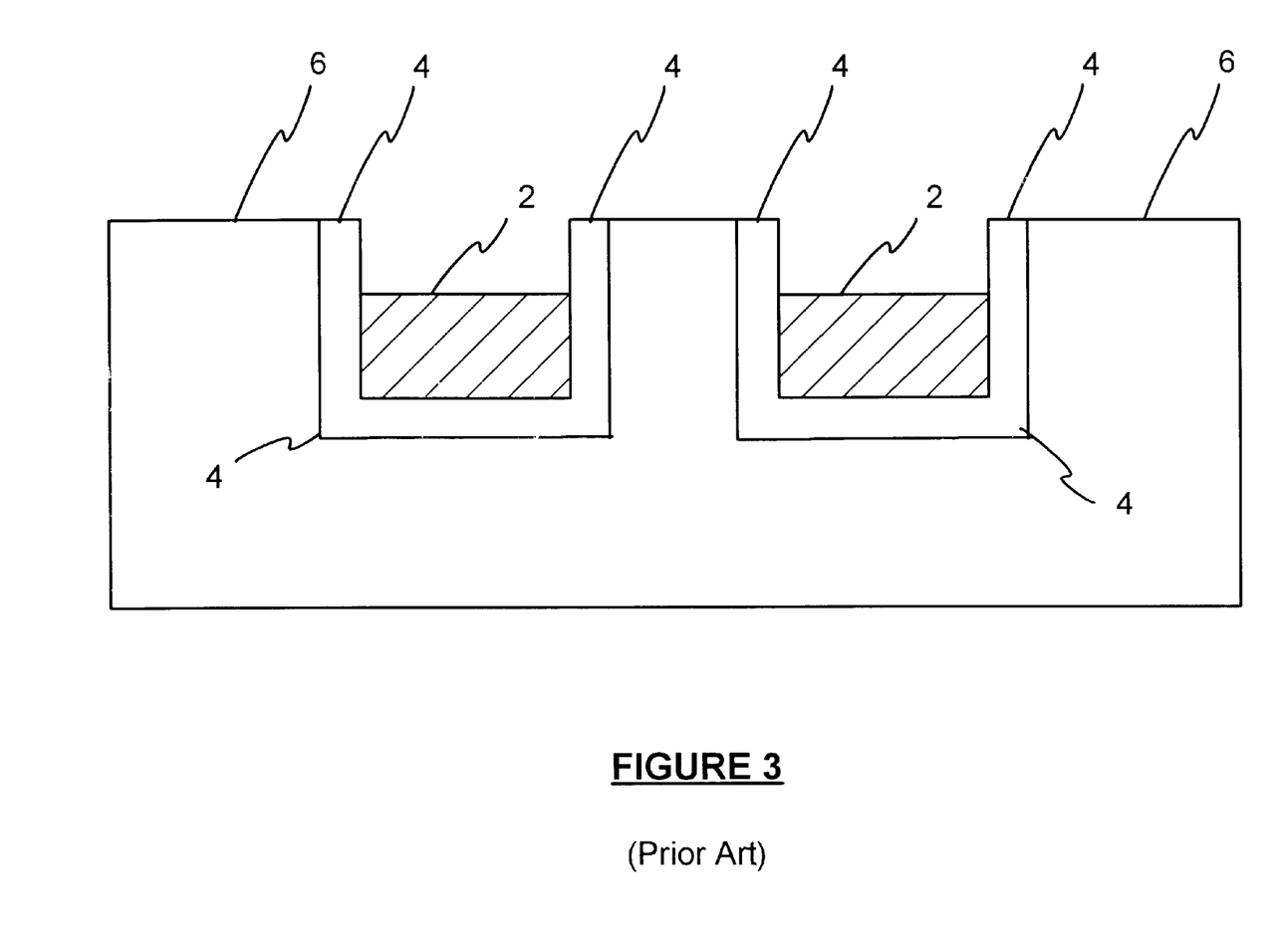
FIG. 3 is a schematic illustration of the semiconductor wafer portion of FIG. 1 after a CMP step has removed metal and was continued until excess metal was completely removed and recessed metal plugs were formed in the dielectric trenches.

As an alternative to the prior art one-step process described with reference to FIGS. 2 and 3, there is also a prior art two-step process, using in the first step a slurry with a greater removal rate for metal, for example a removal rate of metal about 20 times greater than for dielectric. An end point must first be selected for cessation for the first polishing step that is intended to remove the bulk of the metal shown in FIG. 1 to achieve the structure show in FIG. 4A. It is apparent that end point detection in polishing from the structure of FIG. 1 to FIG. 4A may not be possible, since the surface is still a substantially continuous layer of metal. Notwithstanding, based on experience, a polish time can be selected such that a thin metal layer is achieved. At that point, after rinsing to remove the first slurry, polishing could continue with a second slurry having a 1:1:1 selectivity to produce the structure shown in FIG. 4B. The production of such a structure does, however, require a true 1:1:1 selectivity between the compositions in the semiconductor wafer surface undergoing polishing. These ratios must be stable with respect to both the process and the particular patterns on the wafer surface. Generally, the achievement of such stability is not common in practice.

Figure 5A:
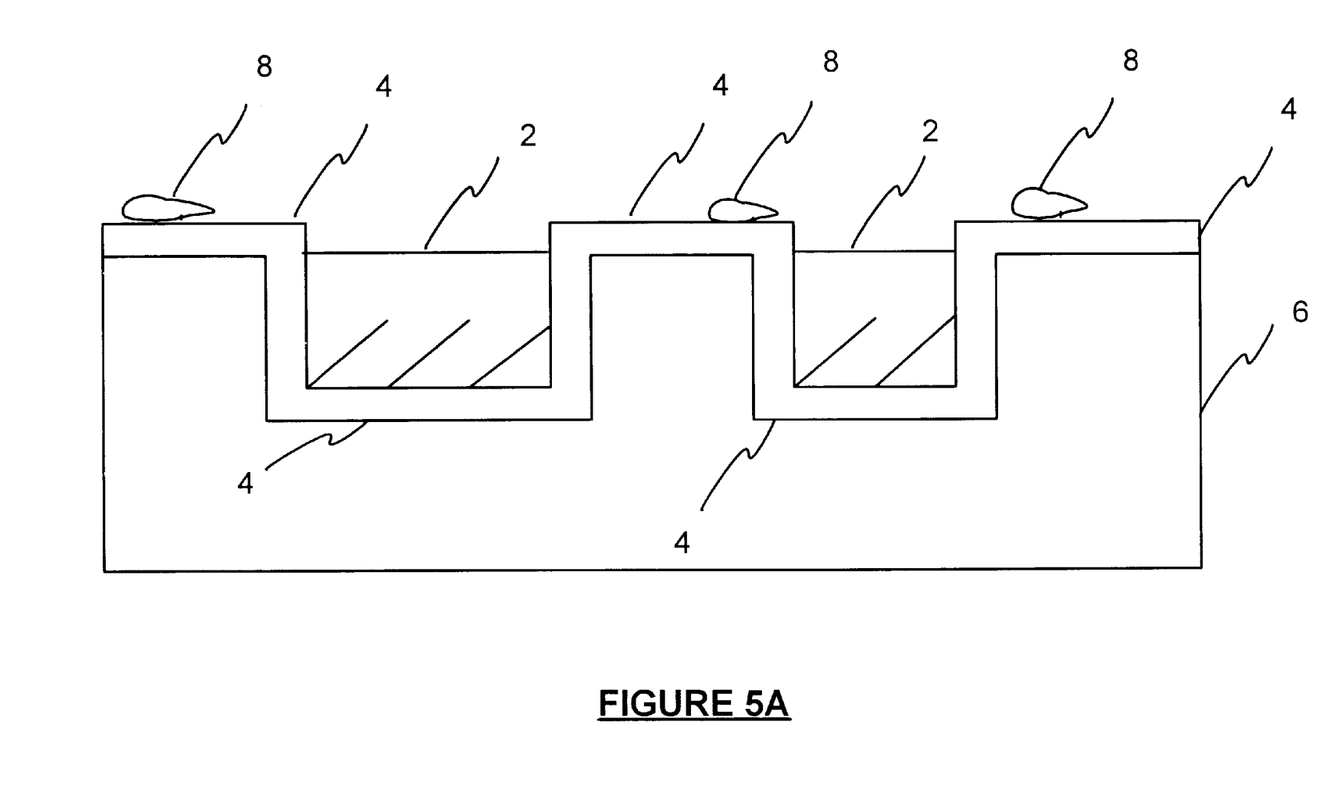
FIG. 5A is a schematic illustration of a cross section of a portion of a semiconductor wafer as in FIG. 1 after a first stage of CMP with a slurry, showing moderate dishing of the metal and metal residues on polished surfaces.
Figure 5B:
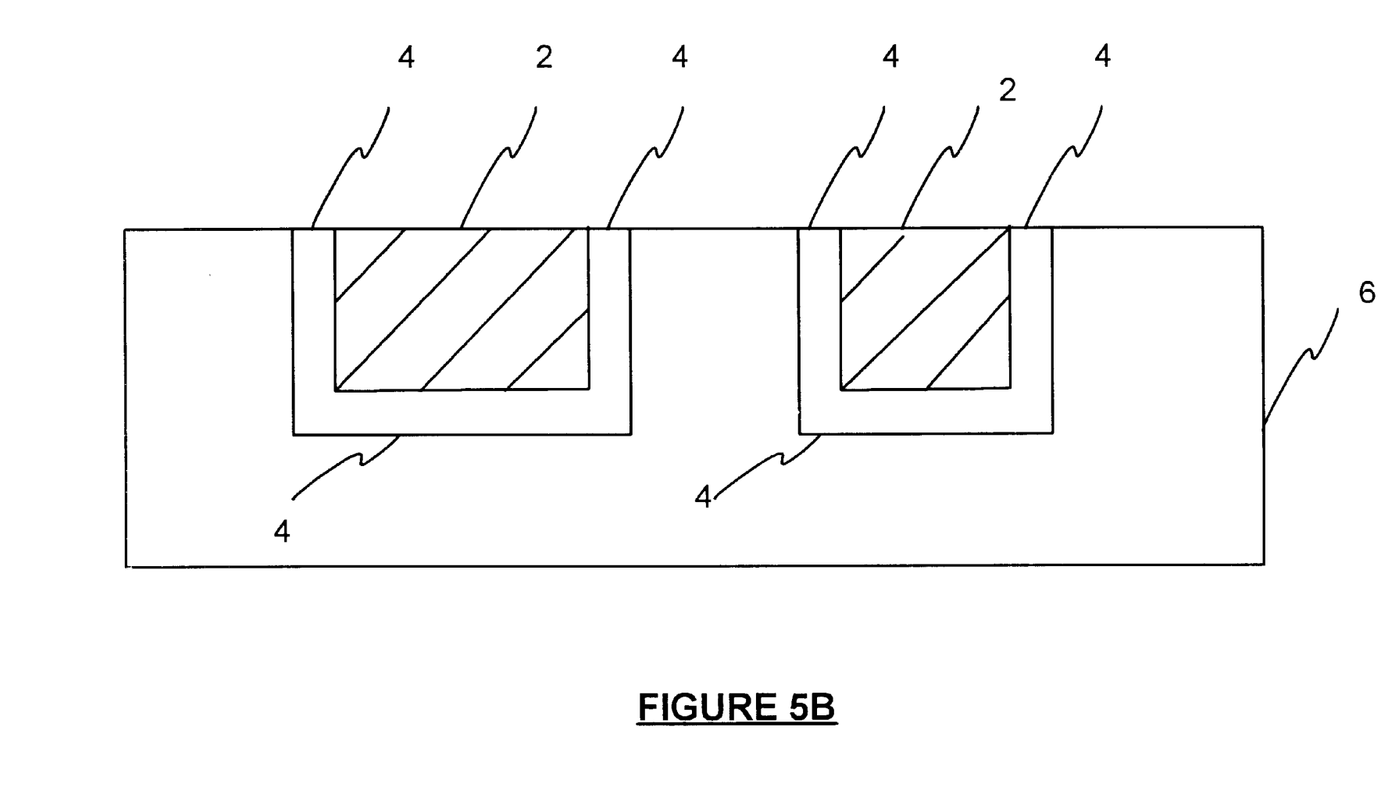
FIG. 5B is a schematic illustration of the semiconductor wafer section of FIG. 5A after CMP with a second step slurry having a selectivity ratio of 1:1:2 (metal:barrier:dielectric) in accordance with the invention, showing repaired topography that is substantially planar.

The process in accordance with the invention is much more useful as a practical matter. According to the invention., after a first step of polishing that removes most of the excess metal shown in FIG. 1, a structure such as that shown in FIG. 5A is produced. This structure shows moderate dishing in that the metal 2 is recessed in trenches in the dielectric 6. Moreover, metal residues 8 may be left on the barrier surface. After rinsing, preferably with the deionized water, to substantially remove the first slurry from the polishing area, chemical-mechanical polishing continues with a second slurry in accordance with the invention, that has a higher selectivity (rate of removal) for dielectric relative to metal. Thus, for example, a second step slurry having a selectivity of 1:1:2 (with reference to metal:barrier:dielectric) produces the end product shown in FIG. 5B. In this figure, the metal residues 8 have been removed, the conformal horizontal barrier layer 4 has been removed, and the dielectric 6 has been polished level with the metal 2. Accordingly, the wafer surface is much more planar than that shown in the prior art of FIG. 3.

Figure 4A:
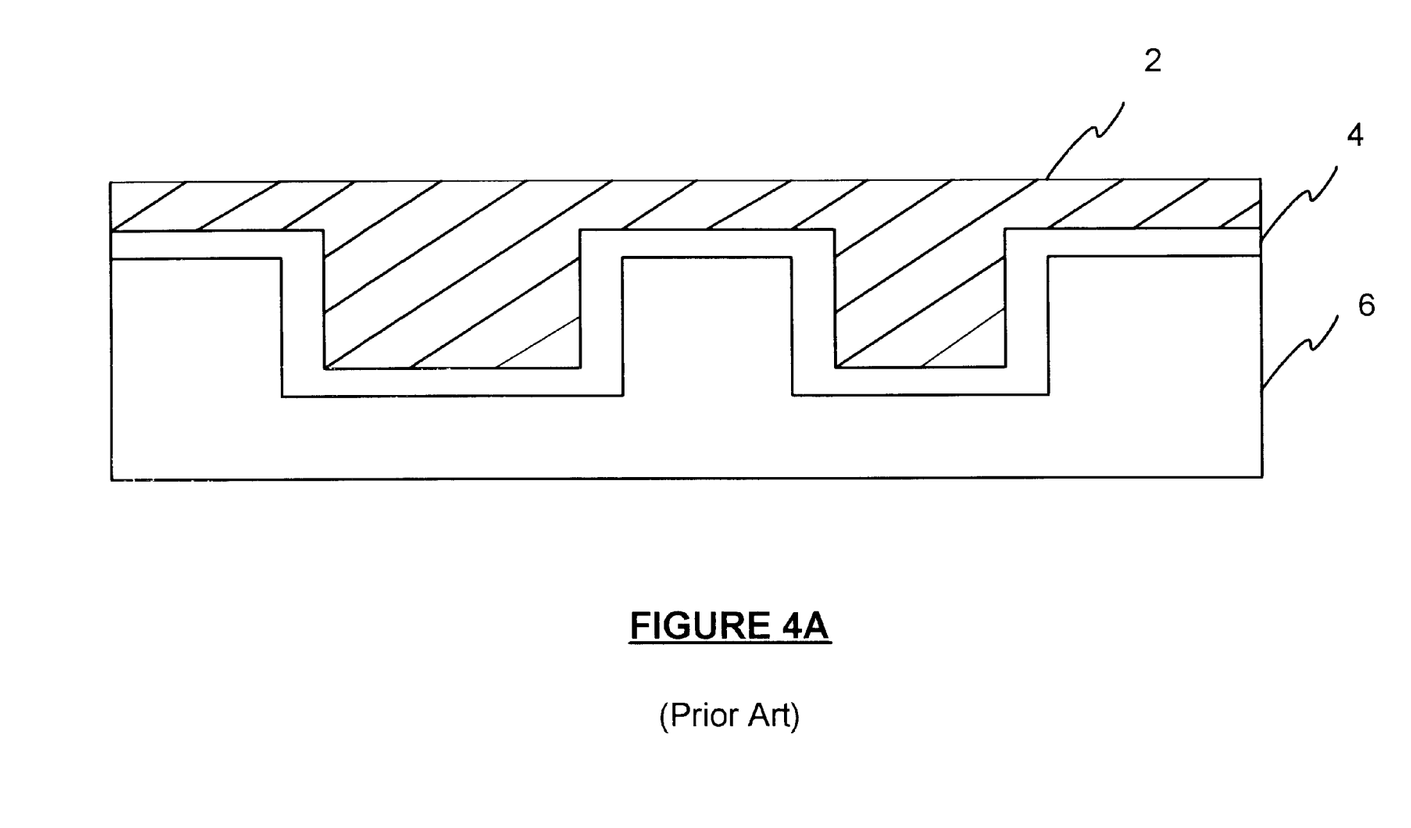
FIG. 4A is a schematic illustration of a cross sectional view of a portion of a semiconductor wafer as in FIG. 1 after a first stage of CMP.
Figure 4B:
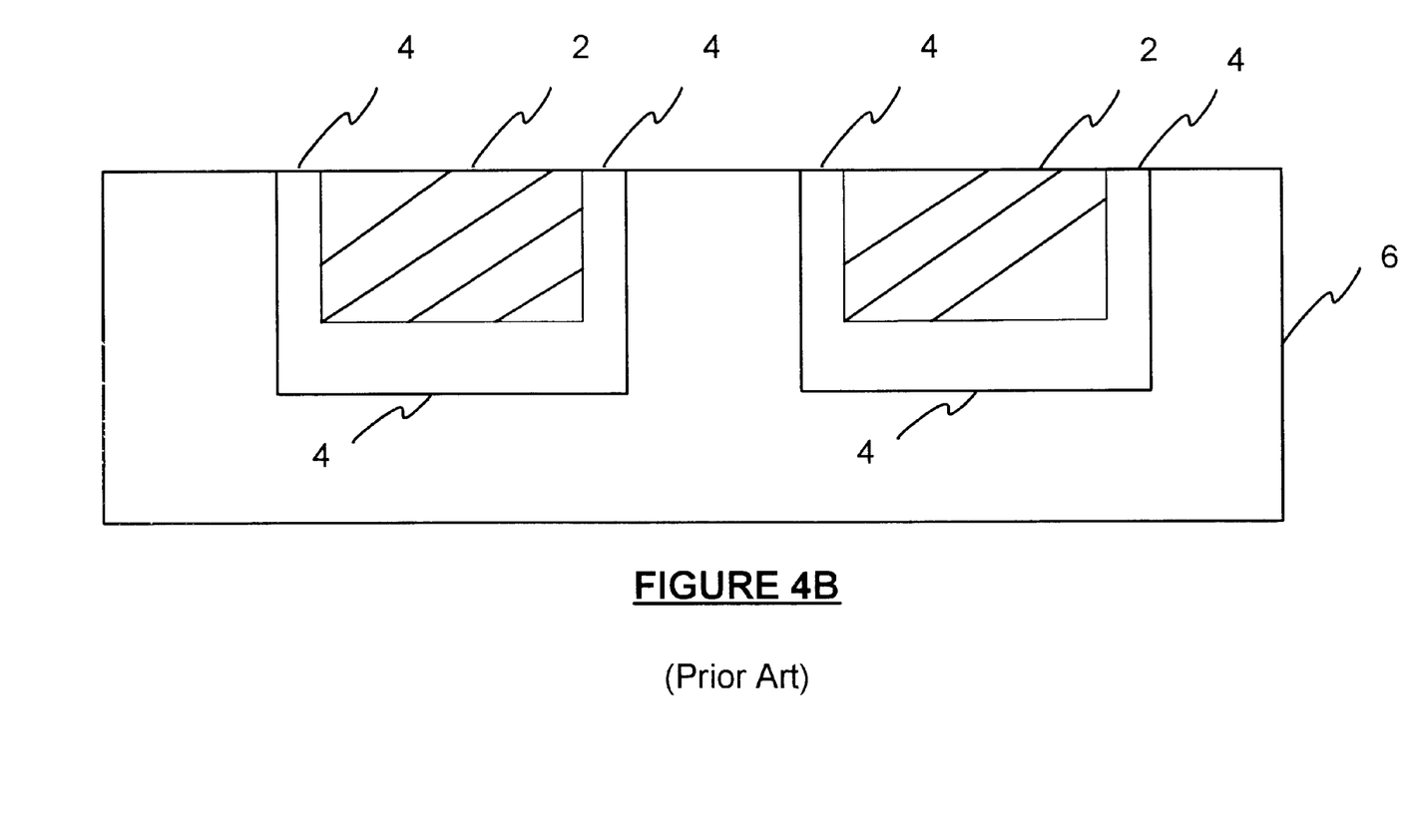
FIG. 4B is a schematic illustration of the semiconductor wafer portion of FIG. 4A after a second stage of CMP with a slurry having a selectivity ratio of 1:1:1 (metal:barrier:dielectric)

The process of the invention is also much more convenient than the prior art process described with reference to FIGS. 4A and B in that it provides a readily detectible end point. Since the first step of polishing is carried out until substantially all excess metal is removed, optical, motor current monitoring or temperature monitoring techniques known in the art may be used to detect the end point. In contrast, since a thin layer of metal remains at the end of the first stage of the prior art method of FIG. 4A, end point detection is difficult. Process time may be used to predict end point, but this depends upon maintaining substantial uniformity from one wafer to the next and is therefore not highly reliable.

As explained above, the process of the invention provides significant advantages over the prior art (FIG. 3) and other possible two-step prior art techniques (FIGS. 4A and 4B) to provide improved planarization in a method that is readily automated.

Further, in accordance with the invention, existing CMP apparatus may be modified to use the two-step process of the invention. The required modifications would be readily apparent to those of skill in the art based on the above explanation of the invention.

The above explanation of the invention, with reference to the drawings, constitutes a description of preferred embodiments, and does not limit the scope of the invention which is determined by the entirety of this document and what its teachings would suggest to one of ordinary skill in the art, and by the appended claims, given their due scope.

What is claimed is:

1. A method of chemical-mechanical polishing of a surface of a semiconductor wafer containing metallic circuitry formed by a damascene or dual-damascene process, the method comprising:
   (i) polishing the wafer surface with a polishing pad and a first slurry the surface comprising a metallic layer overlying a conformal barrier layer, the barrier layer overlying dielectric, the metallic layer comprising plugs recessed into surrounding dielectric, the circuitry of the surface comprising a metal selected from the group consisting of copper, silver, gold, aluminum and alloys of these:
   (ii) detecting a first endpoint for polishing and preparing the wafer surface to receive a second slurry for a second step of polishing the first endpoint detected when the first metallic layer is substantially completely removed, the barrier layer is exposed on raised features of the wafer surface, and upper surfaces of the plugs are below the exposed barrier layer; and (iii) polishing the wafer surface with a second slurry having a rate of removal of from about 1.2 to about 4 times greater for dielectric than metal until a second endpoint is reached when the exposed barrier layer is removed and the upper surfaces of the plugs are flush with surrounding dielectric.

2. The method of claim 1, wherein the polishing with a second slurry comprises polishing with a slurry having a removal rate of from about 1.5 to about 2.5 times greater for dielectric than for metal.

3. The method of claim 1, wherein the polishing with a second slurry comprises polishing with a slurry having a removal rate of from about 1.8 to about 2.3 times greater for dielectric than for metal.

* * * * *